United States Patent [19]
Peterson

[11] Patent Number: 5,930,162
[45] Date of Patent: Jul. 27, 1999

[54] QUANTUM RANDOM ADDRESS MEMORY WITH POLYMER MIXER AND/OR MEMORY

[75] Inventor: William M. Peterson, Chandler, Ariz.

[73] Assignee: Motorola, Inc., Schaumburg, Ill.

[21] Appl. No.: 09/164,061

[22] Filed: Sep. 30, 1998

[51] Int. Cl.$^6$ .................................................. G11C 11/46
[52] U.S. Cl. ....................... 365/151; 365/167; 365/148; 365/158
[58] Field of Search .................................. 365/151, 153, 365/167, 148, 158

[56] References Cited

U.S. PATENT DOCUMENTS 5,547,774   8/1996   Gimzewski et al. ............. 428/694 ML

*Primary Examiner*—Andrew Q. Tran
*Attorney, Agent, or Firm*—William E. Koch

[57] ABSTRACT

Quantum pseudo-random address memory apparatus including a low dimensional plurality of address ports, a plurality of polymer nano-memory elements, polymer mixer elements coupling the address ports to a high dimensional plurality of the plurality of polymer nano-memory elements, and data output ports and structure coupled to the plurality of polymer nano-memory elements. The high dimensional plurality of polymer nano-memory elements is greater than the low dimensional plurality of address ports by a number resulting in substantially error free memory recalls.

15 Claims, 13 Drawing Sheets

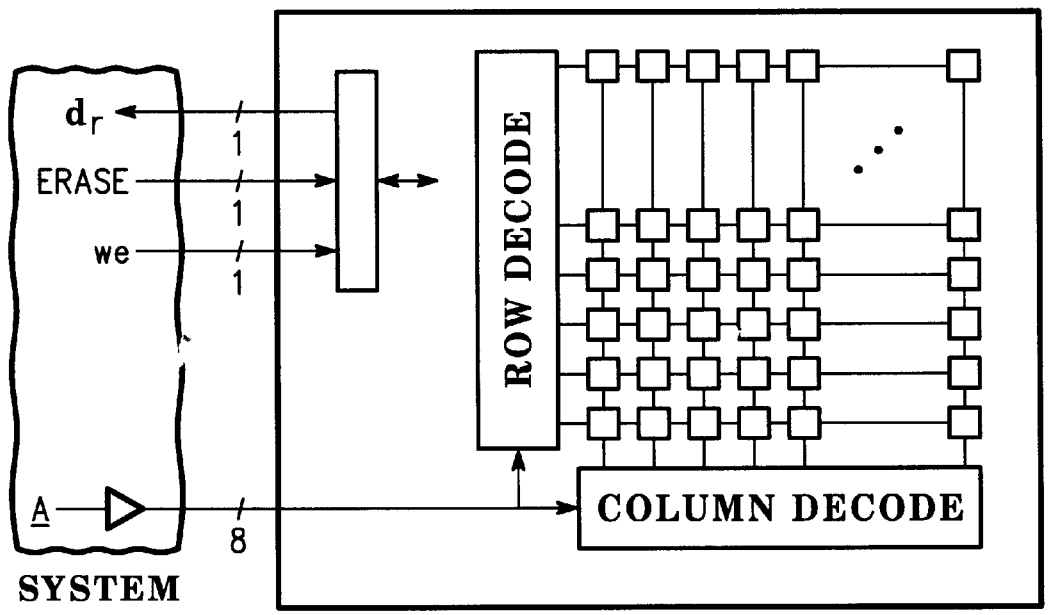
- *PRIOR ART* -  FIG. 1
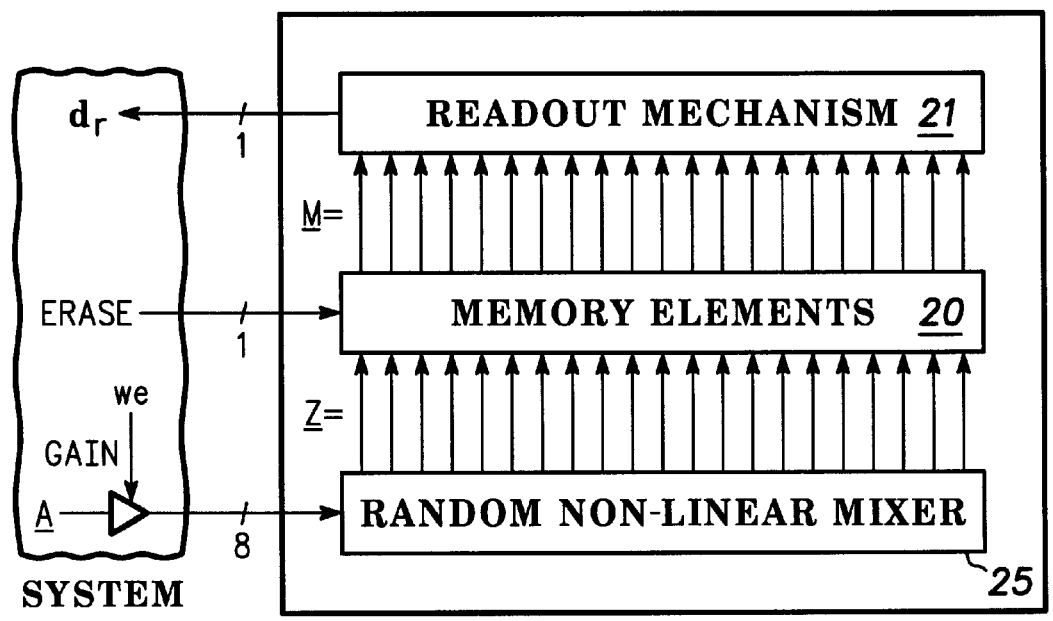
FIG. 2

QUANTUM RANDOM ADDRESS MEMORY WITH POLYMER MIXER AND/OR MEMORY

FIELD OF THE INVENTION

The present invention pertains to memory apparatus and more specifically to a novel memory and addressing scheme.

BACKGROUND OF THE INVENTION

At the present time memories are utilized in virtually every type of electrical and electronic device to store data, e.g. information, operating instructions, etc. These memories are manufactured in a large variety of types including random access memories (RAM), read only memories (ROM), erasable/programmable memories (EPROM), electronically erasable/programmable memories (EEPROM), to name a few. Also, these various memories are manufactured using a variety of techniques and physical concepts, e.g. magnetic memories, capacitive memories, etc., which are in turn divided into active arrays and passive arrays. Further, at least some of the memories are small enough to allow up to mega-bytes of information to be stored in a single memory module of practical size.

However, one major problem that is prevalent in all of the prior art memories is the fact that each bit of memory must be addressed individually by means of critically positioned conductors to read (and/or write) information from (or to) the bit. Most conventional memories are intrinsically two dimensional. The usual addressing technique for 2-D memories requires the selection of a row and column port of the array which are common to the selected bit. These rows and columns provide access to localized memory elements that are uniformly distributed in one plane. This results in hundreds of critically positioned conductors (rows, columns and I/O terminals or ports) in conjunction with the large arrays of memory bits making up a large memory. In many instances the I/O ports actually require more chip real estate or area than the array of memory bits. Because present day manufacturing techniques are limited to some type of lithography in the fabrication of the memory arrays and because the line size of the lithography is limited to submicron (generally 0.25 micron), the size of present day memories is quickly reaching an upper limit. This is primarily due to escalating fabrications costs as well as undesired quantum effects. (For example, Professor W. Maly at Carnegie Mellon showed that extrapolations of cost projections in the SIA's 1997 National Technology Roadmap for Semiconductors result in single-die costs as high as $1800 for DRAMS.) Further, as lithography line sizes are reduced and memories are made larger, the cost of manufacturing the memories is increasing at a very substantial rate.

Yet, the motivation for continued miniaturization is such that all major corporations are conducting research to find nanometer-sized implementations for the logic and memory functions. In the published research literature on such nanometer-sized functions, three major problems remain: unacceptably high error rates at room temperatures; lack of cost effective mass production; and no effective I/O interface with ordinary CMOS logic.

Thus, it would be very beneficial to provide a memory which does not require (expensive) precision fine detail lithography in order to isolate and access each individual bit in the memory for read and/or write operations.

It is a purpose of the present invention to provide a new and improved memory and logic.

It is another purpose of the present invention to provide a new and improved memory that is relatively simple and inexpensive to manufacture.

It is still another purpose of the present invention to provide a new and improved memory that has virtually no upper limits on the size, or number of bytes it can store.

It is yet another purpose of the present invention to provide a new and improved memory that is highly manufacturable and does not require fine detail lithography to produce the memory elements.

It is a further purpose of the present invention to provide a new and improved memory that is much smaller than prior art memories.

SUMMARY OF THE INVENTION

The above problems and others are substantially solved and the above purposes and others are realized in quantum random address memory apparatus including a low dimensional plurality of address ports, a plurality of nano-memory elements, mixer elements coupling the address ports to a high dimensional plurality of the plurality of nano-memory elements, and data output ports and structure coupled to the plurality of nano-memory elements. The high dimensional plurality of nano-memory elements is greater than the low dimensional plurality of address ports by a number resulting in substantially error free memory recalls.

BRIEF DESCRIPTION OF THE DRAWINGS

Referring to the drawings:

FIG. 1 is a simplified block diagram of a prior art flash memory;

FIG. 2 is a simplified block diagram illustrating various components and their operation in a memory in accordance with the present invention;

DESCRIPTION OF THE PREFERRED EMBODIMENTS

Figure 3:
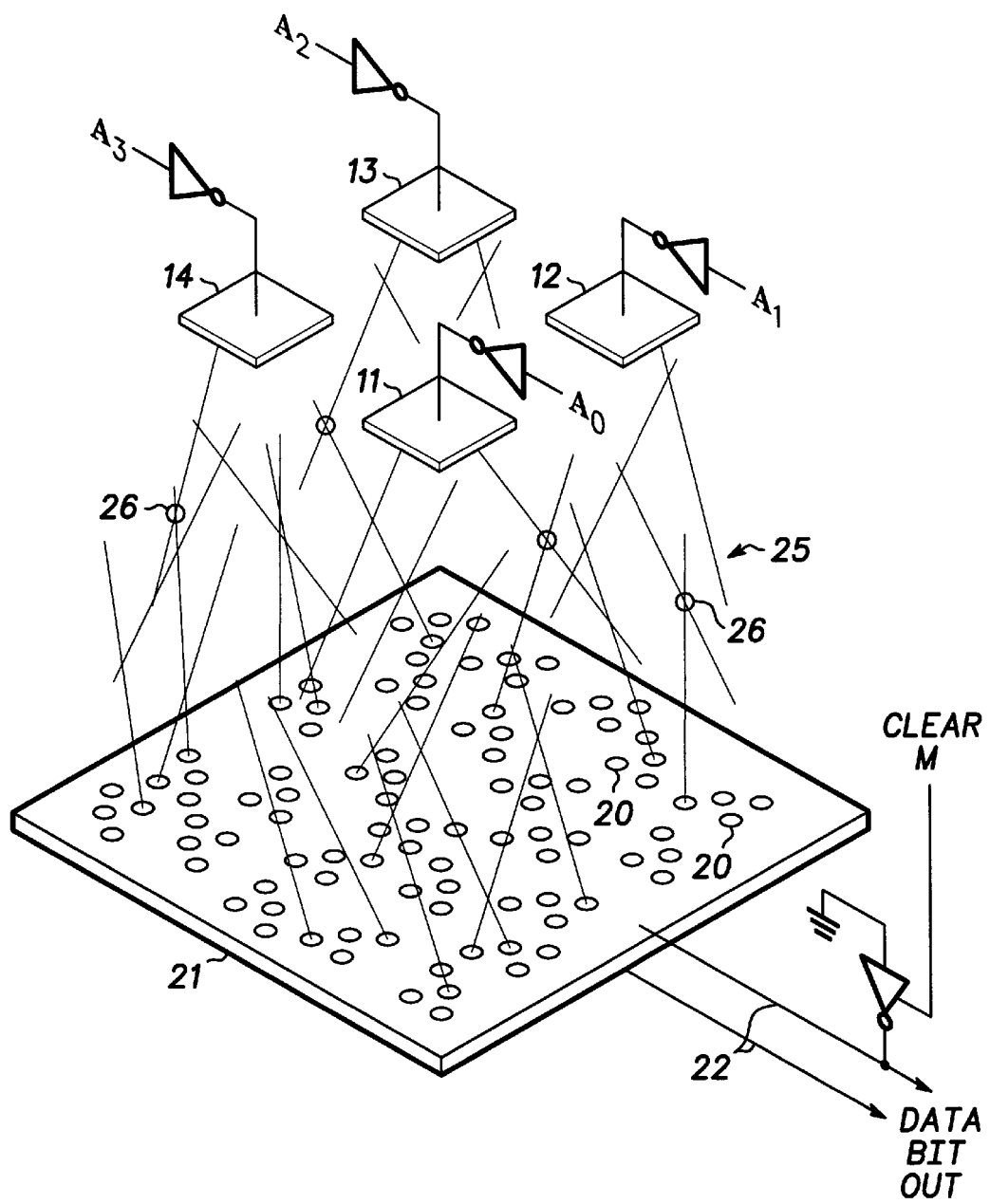
FIG. 3 is a simplified isometric view of quantum random address memory apparatus in accordance with the present invention.

Turning now to the drawings and specifically to FIG. 1, a prior art 256×1 flash memory is illustrated in simplified block form. The operation of the flash memory will be understood by those skilled in the art and, therefore, will not be explained in detail herein. The conventional flash memory uses spatially independent bit cells by splitting the 256 addresses into 16 rows and 16 columns, as shown in FIG. 1. One cell, capable of storing one bit, is positioned at each row-column intersection so that each cell has a unique row-column intersection at which it can be addressed without effecting any of the other cells. It should be noted however, that the prior art flash memory is a two dimensional device only and utilizing any of the well known present practices requires the use of lithography for the fabrication of every bit. Further, the best that can be produced at the present time results in a chip area size of approximately 2000 square microns (for 256 bits).

Turning now to FIG. 2, a simplified block diagram/flow chart is provided illustrating various components and their operation in 256×1 quantum random address memory apparatus 10 in accordance with the present invention. The simplified block diagram/flow chart of FIG. 2 is provided only for use in describing the operation and theory of the apparatus 10 and is not intended to describe a complete working structure. Apparatus 10 of FIG. 2 includes eight address ports, $A_0$ through $A_7$, that are illustrated as A and are coupled through eight buffer amplifiers to pseudo-random nonlinear mixer elements 25. Because of the number of mixer elements 25 and the connections to the eight address ports, as illustrated in FIG. 2, eight address bits into the system results in 10,000 bits (channels, lines or bits) out. The mixer elements 25 are coupled to memory elements 20 which are in turn coupled to readout mechanism 21. While more memory elements may be included, it is assumed that at least 10,000 memory elements 20 are coupled to 10,000 mixer elements 25. Here it should be noted that 10,000 memory elements are utilized because that number yields a substantial noise margin, as will be explained presently, as well as a small area of about 4 square microns for a 256×1 bit memory. Thus, apparatus 10 has a total area approximately 500 times smaller than the area of the prior art flash memory illustrated in FIG. 1.

To understand the operating principle of apparatus 10, it should be understood that statistically independent bit cells (statcells) are used. First, vector M, which comprises charges on 10,000 nano-memory elements 20, such as polymer molecules, quantum dots, etc., is cleared or randomized. This clears all 256 statcells to the logical '0' state. Now only the statcells that are selected to be logical '1's need to be written. All 256 bits are stored, in a distributed fashion, in the memory vector M. Each nano-memory element in M stores only a small fraction of each of the 256 bits. That is, each whole bit is distributed among all (or many) of the 10,000 nano-memory elements of M. This distributed code provides excellent noise and fault tolerance.

For each address A, there is a different pseudo-random vector $Z_A$ of dimension 10,000. The 10,000 nano-memory elements in each $Z_A$ vector are each +1 or −1. (Note, other functionally equivalent systems can be used, too. For example, '1' and '0' with positive summation and negative summation nodes.) The independence of the 256 statcells is achieved based upon simple probabilities. For example, writing a '1' bit into the statcell corresponding to address A=35 does not change the data bit in the statcell corresponding to address A=36 because it is almost certain that $Z_{35}$ has nearly zero correlation with $Z_{36}$. Here it should be understood that the highly accurately positioned memory elements of conventional memories are one extreme of the spectrum while totally random memory elements are the other extreme. There is a lot of middle ground between these extremes which can be achieved by biasing the statistics in favor of even more uncorrelated Z vectors. This middle ground is encompassed in the present disclosure in the term "pseudo-random" which is intended to cover everything from totally random to somewhat randomly positioned, as long as the placement does not require fine detail lithography and fine precision alignment.

To read out the data bit stored in statcell 35, simply measure the degree of similarity between the two patterns M and $Z_{35}$. One way to do this is to threshold the scalar product of $Z_{35}$ and M. For example, if $Z_{35}$ is added to M, then this new M' will be more similar to $Z_{35}$ (i.e. data bit=1) than if the addition had not been done (i.e. data bit=0).

To write a '1' data bit to statcell 35, simply add $Z_{35}$ to M. Likewise, to write a '1' data bit to statcell 36, simply add $Z_{36}$ to M. Note that $Z_{35}$ and $Z_{36}$ are added to the same M. The nearly zero correlation keeps the data bits in statcells 35 and 36 separate and independent.

In essence, statcell independence occurs because adding $Z_{35}$ to M adds +1 to a specific subset$_1$, of the elements in M and subtracts 1 from the remaining specific subset$_2$ of the elements in M. Now, adding $Z_{36}$ to the same M adds as much as it subtracts from the subset$_1$. Likewise, for subset$_2$. The net effect is zero. When the data bit in statcell 35 is read back or recalled (i.e. M is probed with $Z_{35}$), the pattern similarity measure is essentially unchanged. Thus, writing to statcell 36 does not disturb the data in statcell 35. Note that this independence requires pseudo-random vectors of high dimension (10,000 in this example) for excellent error tolerance.

Referring to FIG. 3, a simplified isometric view is illustrated of quantum random address memory apparatus 10 in accordance with the present invention. Because FIG. 3 illustrates a specific embodiment (greatly simplified) of the apparatus illustrated in simplified block form in FIG. 2, similar components will be designated with similar numbers. Apparatus 10 of FIG. 3 is illustrated in a very simplified mode for purposes of this explanation and it should be understood by those skilled in the art that this figure is not intended to limit the scope of the invention in any way. Apparatus 10 includes eight address ports, $A_0$ through $A_7$ (only four of which are illustrated), that are illustrated as square metal pads 11 through 13 which are each coupled to an externally available terminal through a CMOS buffer (for example only). As will be understood by those skilled in the art, eight address ports results in 256 possible input addresses, assuming a binary system. (Note: Although 16 ports, comprising $A_0$ through $A_7$ and $-A_0$ through $-A_7$, is preferred, it still results in just 256 possible addresses).

Apparatus 10 further includes a plurality of nano-memory elements 20 supported on readout mechanism, which in this embodiment is a piezoelectric layer 21. Nano-memory elements 20 can be any of a large variety of devices including portions of polymer molecules, quantum dots, magnetic tunneling junctions, resistors etc. The pseudo-random fabrication and placement of nano-memory elements 20 is a relatively straight forward process involving the deposition of material and not requiring any fine detail lithography, fine alignment, or the like. Example of some fabrication processes for nano-memory elements 20 will be described in more detail presently.

Mixer elements 25 are incorporated to couple address ports, $A_0$ through $A_7$, to a high dimensional plurality of nano-memory elements 20. Mixer elements 25 are pseudo-randomly positioned, non-linear electrically conductive elements, such as self-assembled conductive polymer chains, nano-diodes, or the like. Generally, mixer elements 25 are fabricated by any convenient process that does not require lithography and which results in essentially uncorrelated patterns of energy (e.g. charge) at the 10,000 terminals for every pair of addresses A. Here it should be understood that each of the nano-memory elements 20 are not necessarily connected to one or more of the address ports, $A_0$ through $A_7$. It is only required that a high dimensional plurality of nano-memory elements 20 are connected to a low dimensional plurality of address ports, $A_0$ through $A_7$. Further, the high and low dimensional pluralities are defined such that the high dimensional plurality of nano-memory elements 20 is greater than the low dimensional plurality of address ports, $A_0$ through $A_7$, by a number resulting in substantially error free memory recalls. Through mathematical analysis and extensive testing it has been determined that this number is at least 40, although a smaller number may be utilized in specific applications requiring less accuracy or more tolerance of errors, or if more control/precision is exerted during manufacture. For example, some applications may include self correcting circuits in which more errors in memory recall can be tolerated. In the above example, with 256 possible addresses, the number of connections between nano-memory elements 20 and mixer elements 25 should be at least 40×256 or approximately 10,000. By using at least 40 times as many connections between nano-memory elements 20 and address ports, $A_0$ through $A_7$, as the number of potential addresses in apparatus 10, up to 20% errors can occur in the connections without an output bit error occurring in the data recall.

In the specific embodiment illustrated in FIG. 3, the readout mechanism includes piezo layer 21 which has output ports 22 attached thereto for providing a data bit output for each address applied to address ports, $A_0$ through $A_7$. In the embodiment using piezo layer 21 as the readout mechanism, the data bit output is in the form of a voltage pulse at output ports 22 produced by the interaction of mixer element terminals, the addressed nano-memory elements 20 and the piezo layer 21. For additional information on the operation and construction of piezo layer readout mechanisms see the copending application entitled "Quantum Random Address Memory with Piezo Layer Readout" filed of even date herewith, U.S. application Ser. No. 09/163,879, now pending and assigned to the same assignee.

Figure 4:
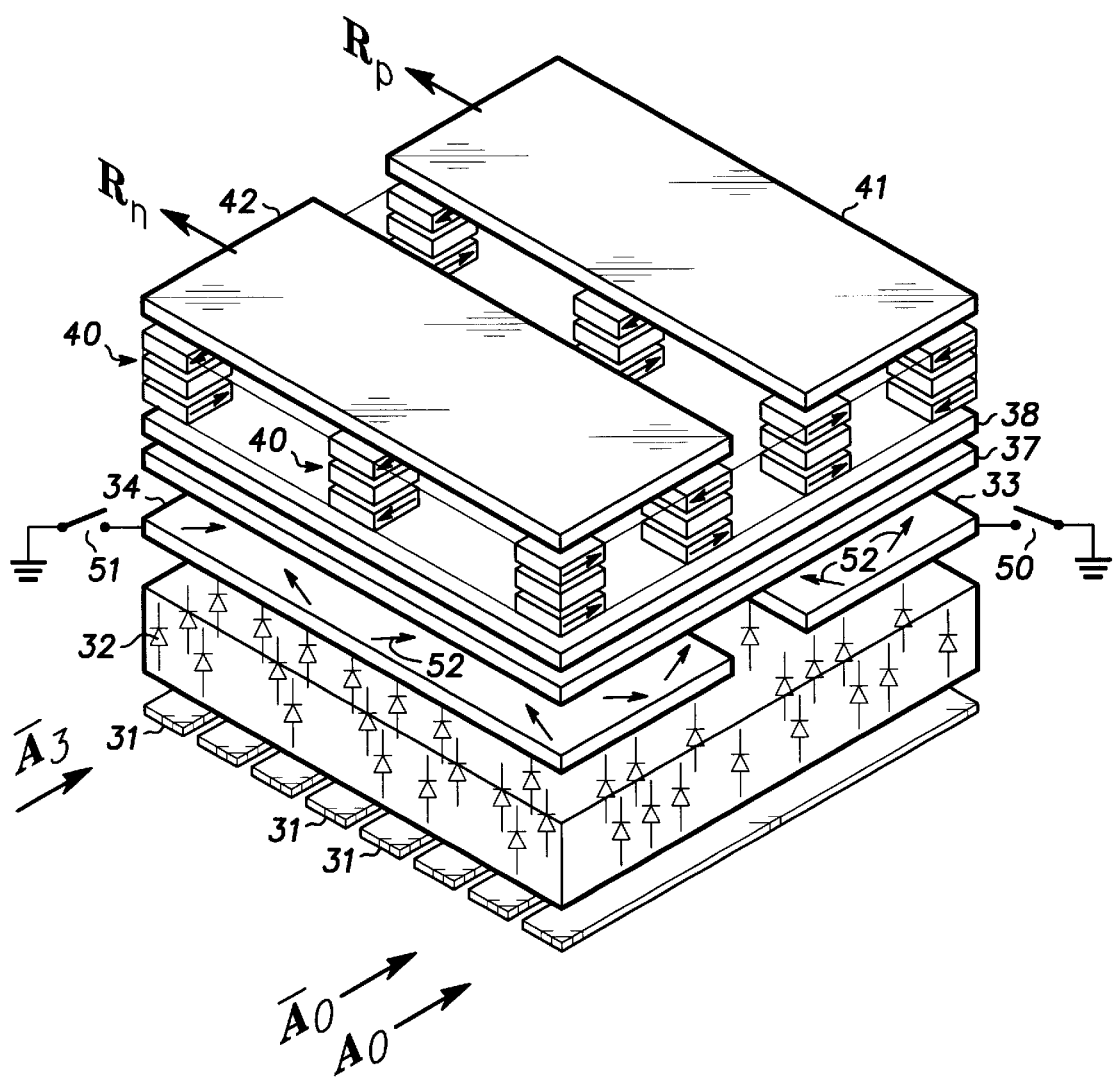
FIG. 4 is a simplified isometric, partial schematic, view of another embodiment of quantum random address memory apparatus in accordance with the present invention.

Turning now to FIG. 4, a simplified isometric, partial schematic, view is illustrated of another embodiment of quantum random address memory apparatus, generally designated 30, in accordance with the present invention. Apparatus 30 includes eight address ports, designated $A_0$ through $A_3$, and the invert of each. In this embodiment the address ports are represented by eight parallel spaced apart conductive strips 31, one strip for each of the address ports. A plurality of mixer elements, which in this embodiment are pseudo-randomly placed, self-assembled non-linear polymer molecules 32 (illustrated schematically as diodes for convenience), have one end coupled to the address ports 31. Generally, as will be explained presently, polymer molecules 32 are formed in a layer conductive strips 31 positioned on one surface so that each strip 31 is connected pseudo-randomly to a pseudo-random number of polymer molecules 32.

A pair of spaced apart electrical conductors 33 and 34 are positioned over polymer molecules 32 (on an opposing side of the layer) so as to extend transverse to the parallel spaced apart strips 31 with each electrical conductor 33 and 34 coupled to a different approximately one half of the plurality of polymer molecules 32. While, as will become apparent presently, polymer molecules 32 may contain memory elements as well as mixer elements, in this specific embodiment polymer molecules 32 form only the mixer elements and the memory elements are formed individually.

An electrical insulating layer 37 is positioned over conductors 33 and 34 and an electrically conducting layer 38 is positioned over insulating layer 37. A plurality of nano-memory elements, which in this embodiment are pseudo-randomly placed magnetic tunneling nano-junctions 40, are positioned on layer 38. A pair of spaced apart electrical conductors 41 and 42 are positioned over magnetic tunneling nano-junctions 40 so as to extend transverse to the parallel spaced apart strips 31 (generally overlying conductors 33 and 34) with each electrical conductor 41 and 42 coupled to a different approximately one half of the plurality of nano-junctions 40. Conductors 41 and 42 are connected to provide signals $R_p$ and $R_n$, respectively, which when combined ($R_p - R_n$) produce a data bit output. Generally, conductors 33 and 41 define a 'p' section of apparatus 10 and conductors 34 and 42 define a 'n' section. It should be noted that none of the structure illustrated in FIG. 4 requires lithography, except possibly strips 31 and electrical conductors 33, 34 and 41, 42.

Each magnetic tunneling nano-junction 40 includes a pair of magnetic layers separated by a very thin non-magnetic non-conducting layer which serves as a barrier. Also, each magnetic tunneling nano-junction 40 is sandwiched between layer 38 and either conductor 41 or 42 so that one magnetic layer is positioned on layer 38 and the other magnetic layer is positioned on one of conductors 41 or 42. With an appropriate voltage applied carriers will tunnel from one of the magnetic layers to the other magnetic layer through the barrier layer. Each magnetic tunneling nano-junction 40 appears electrically as a resistance with the amount of resistance being determined by the position of magnetic vectors in each of the two magnetic layers. If the magnetic vectors in a nano-junction are pointed in the same direction (parallel) the resistance is a minimum and if the vectors are pointed in opposite directions (antiparallel) the resistance is a maximum. Thus, by setting the magnetic vectors in each nano-junction 40 a '1' or a '0' (represented by a low or a high resistance) can be stored. For additional information on the operation and construction of magnetic tunneling nano-junctions 40, see the copending application entitled "Quantum Random Address Memory with Magnetic Tunneling Nano-Junctions", filed of even date herewith, U.S. application Ser. No. 09/163,880, now pending and assigned to the same assignee.

In the operation of apparatus 30, conductor 33 can be grounded through a switch 50 to write a '1' into the memory (by modifying the 'p' section) and conductor 34 can be grounded through a switch 51 to write a '0' into the memory (by modifying the 'n' section). When switch 50 is closed, for example, conductor 33 is grounded, Polymer molecules 32 connected to conductor 33 produce currents in conductor 33 (represented by arrows 52) in accordance with the signals applied to strips 31, which create fields that modify the magnetic vector in the closest magnetic tunneling nano-junction 40. To read the stored information, a signal is applied to conductive layer 38 and read at conductors 41 and 42 as $R_p$–$R_n$. Again it must be understood that the number of polymer molecules 32 and the number of magnetic tunneling nano-junctions 40 are great enough to insure that a write signal applied to each strip 31 effects a substantially different group of polymer molecules 32 and magnetic tunneling nano-junctions 40.

Figure 5:
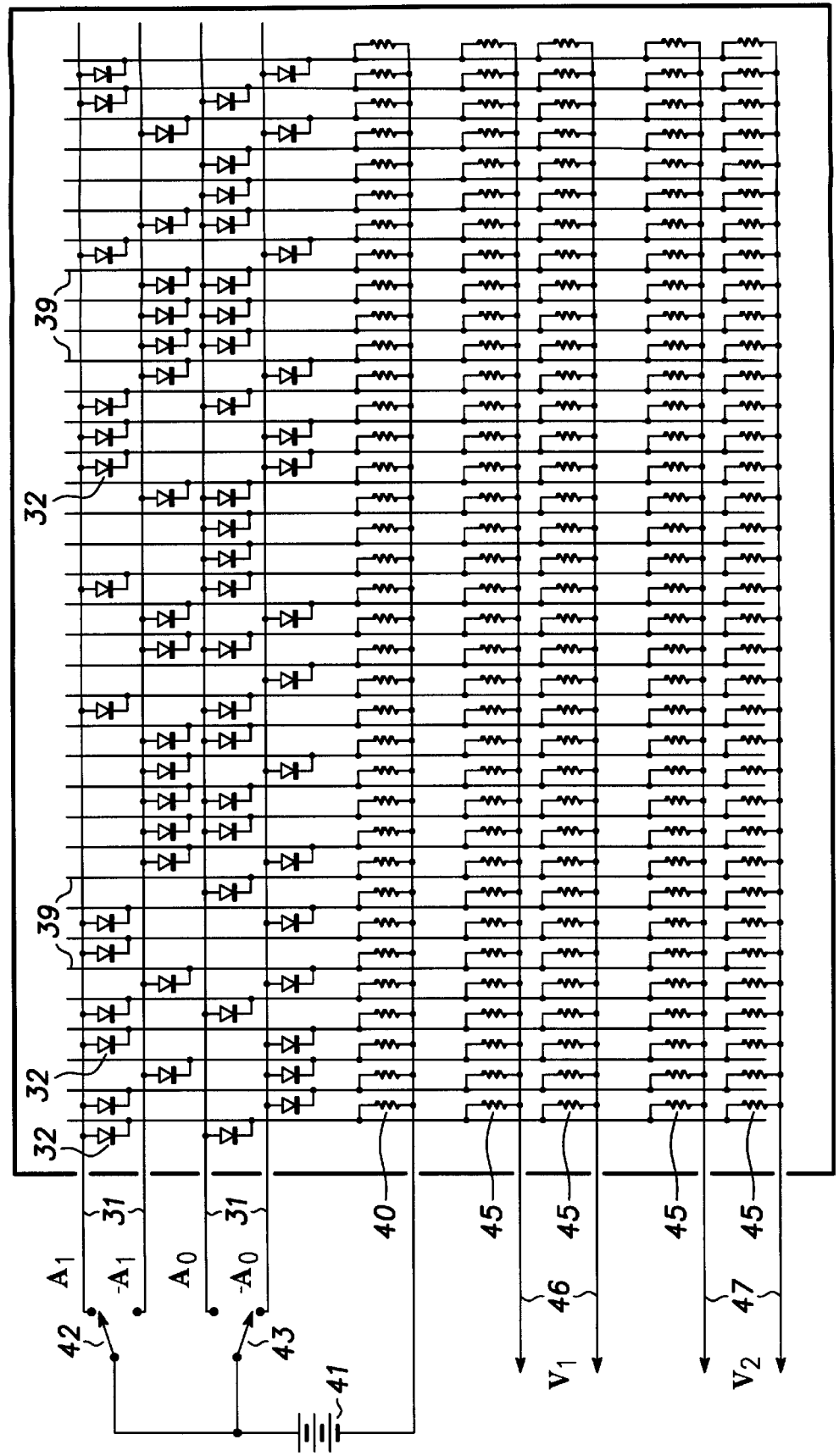
FIG. 5 is a greatly simplified schematic view of the quantum random address memory apparatus illustrated in FIG. 4.

Turning now to FIG. 5, a greatly simplified schematic view is illustrated of the quantum random address memory apparatus 30 illustrated in FIG. 4. The schematic diagram of FIG. 5 is intended to aid in the understanding of apparatus 30 of FIG. 4 and is not intended as a rigorous representation of that apparatus. For simplicity, only four conductive strips 31, designated individually as $A_0$, –$A_0$, $A_1$, and –$A_1$, for convenience, are illustrated for address ports. (It should be understood that the minus sign, e.g. –$A_0$, indicates a negative, reciprocal, or compliment of the mating signal, i.e. $A_0$) Also, a plurality of polymer molecules 32 (illustrated schematically as diodes), representing mixer elements, each have one end (the anode) connected to one of the strips 31 for simplicity in explaining the addressing, as will be understood presently. Further to accentuate the different connections of the mixer elements different polymer molecules (diodes) are connected to each strip 31. The mixer, including polymer molecules 32, has outputs (for example, the 10,000 terminals described in conjunction with FIG. 3) represented in FIG. 5 by a plurality of mixer leads 39. Each mixer lead 39 is connected through an associated resistor 40 to the negative side of a power supply 41. (Note: One skilled in the art can easily substitute alternate current return paths). The positive side of power supply 41 is connected to the arms of a pair of two position switches 42 and 43, which represent the application of an address (1 or 0) to strips 31. A plurality of nano-memory elements 45 are illustrated schematically as resistors each having one end connected to one of the plurality of mixer leads 39. In this simplified schematic view a first data output port $V_1$ is represented by a pair of output leads 46 and a second data output port $V_2$ is represented by a pair of output leads 47. The opposite end of each of the nano-memory elements (resistors 45) is connected to one of the pair of output leads 46 and/or one of the pair of output leads 47. The resistance values of resistors 45 form the M vector.

In this embodiment, to simply illustrate the operation, the pair of switches 42 and 43 are connected to complete a circuit between a selected pair of strips 31 and power supply 41. Switch 42 applies a positive voltage to $A_1$ in a first position and to –$A_1$ in a second position. Switch 43 applies a positive voltage to $A_0$ in a first position and to –$A_0$ in a second position. In each instance the positive voltage is applied to the anode of a different set of polymer molecules 32 and represents a 1 or a 0. The negative side of power supply 41 is connected to each mixer lead 39 through associated resistor 40 to complete the circuit for purposes of this representation.

Figure 6:
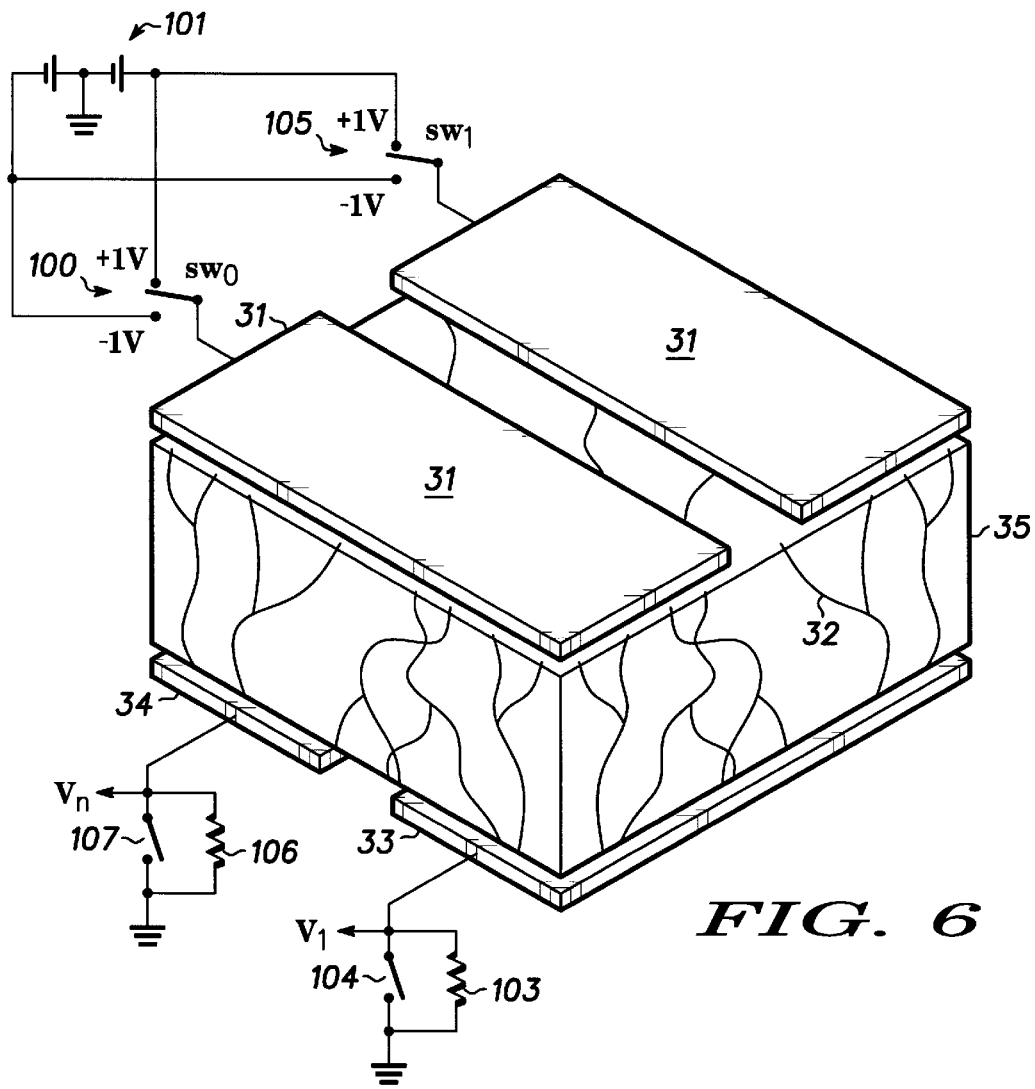
FIG. 6 is a simplified isometric view of a layer of pseudo-randomly placed, self-assembled non-linear polymer molecules coupled to test circuitry.

Referring specifically to FIG. 6, a simplified isometric view is illustrated of a layer 35 of pseudo-randomly placed, self-assembled non-linear polymer molecules 32 coupled to test circuitry. Components similar to those described in FIG. 4 are designated with similar numbers to aid in understanding the correlation of the figures. Also, it should be understood that the test circuitry of FIG. 6 is being illustrated and described as one specific method which can be used in the selection of appropriate self-assembled non-linear polymer molecules 32. Further, self-assembled non-linear polymer molecules 32, for purposes of demonstrating this test, have nonlinear and adaptive properties which serve as both the mixer elements and the memory elements, respectively. While it will be understood by those skilled in the art that there are literally an infinite number of different molecules that can be used to provide the purposes of the present invention, one specific example of a typical material which can be used as self-assembled non-linear polymer molecules 32 is polyacetylene. Other materials and embodiments will be described below.

For convenience of illustration and description, only two address strips 31 ($A_1$ and $A_0$) are illustrated. Spaced apart electrical conductors 33 and 34 are positioned over layer 35 so as to extend transverse to the parallel spaced apart strips 31 with each electrical conductor 33 and 34 coupled to a different approximately one half of the plurality of polymer molecules 32 in layer 35. The movable arm of a two position switch 100 is connected to address input $A_0$ and the contacts of switch 100 are connected to a +1 volt and a –1 volt power supply, respectively, which in this embodiment are illustrated as a pair of batteries 101. Electrical conductor 33 is connected through a load resistor 103 to ground with an output signal available at a terminal $V_p$. A switch 104 is connected in parallel across load resistor 103 and serves as a write switch in the closed position. The movable arm of a second two position switch 105 is connected to address input $A_1$ and the contacts of switch 105 are connected to the +1 volt and a –1 volt of batteries 101. Electrical conductor 34 is connected through a load resistor 106 to ground with an output signal available at a terminal $V_n$. A switch 107 is connected in parallel across load resistor 106 and serves as a write switch in the closed position.

Figure 7:
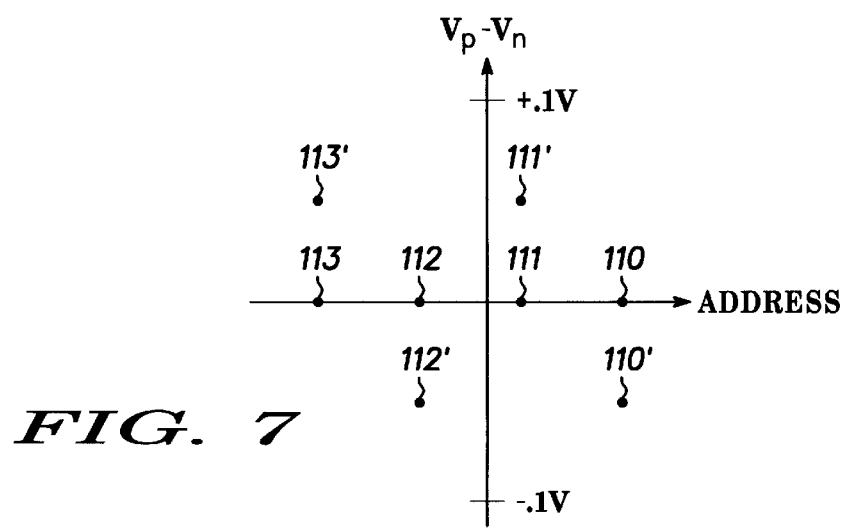
FIG. 7 is a simplified graphical representation of the electrical operation of the structure illustrated in FIG. 6.

With additional reference to FIG. 7, a simplified graphical representation is illustrated of the electrical operation of the structure illustrated in FIG. 6. The graphical representation of FIG. 7 is intended to illustrate the adaptive characteristic of self-assembled non-linear polymer molecules 32 in layer 35 and is further included to illustrate a typical operation for specific self-assembled non-linear polymer molecules 32. The vertical axis indicates the output signal $V_p$–$V_n$ with the area above the horizontal axis representing a positive voltage (up to +0.1 volts) and the area below the horizontal axis representing a negative voltage (down to –0.1 volts). The horizontal axis indicates the various addresses available, which in this embodiment include: a '0' address in which negative signals are applied to both inputs $A_0$ and $A_1$; a '1' address in which a negative signal is applied to $A_1$ and a positive signal is applied to $A_0$; a '2' address in which a positive signal is applied to $A_1$ and a negative signal is applied to $A_0$; and a '3' address in which positive signals are applied to both inputs $A_0$ and $A_1$.

Immediately after a bulk erase signal, or prior to the application of any write signals to layer 35, the various self-assembled non-linear polymer molecules 32, represented by dots 110, 111, 112, and 113, are positioned on the horizontal axis, i.e. the voltages are zero and no data is stored. By closing either of the switches 104 or 107 (see FIG. 6), the voltages applied by switches 100 and 105 provide sufficient current to write data into self-assembled non-linear polymer molecules 32 of layer 35. The choice of closing switch 104 or switch 107 determines the data bit being written ('0' or '1'). In this embodiment and for purpose of this explanation: when the '0' address is applied, self-assembled non-linear polymer molecules 32 represented by dot 110 adapt to position 110', i.e. a negative voltage output $V_p-V_n$; when the '1' address is applied, self-assembled non-linear polymer molecules 32 represented by dot 111 adapt to position 111', i.e. a positive voltage output $V_p-V_n$; when the '2' address is applied, self-assembled non-linear polymer molecules 32 represented by dot 112 adapt to position 112', i.e. a negative voltage output $V_p-V_n$; and when the '3' address is applied, self-assembled non-linear polymer molecules 32 represented by dot 113 adapt to position 113', i.e. a positive voltage output $V_p-V_n$. Here it should be understood that the result indicated by the graph of FIG. 7 is a desired result and actual results will vary depending upon the specific material utilized. It will further be clear to the skilled artisan that a large variety of self-assembled non-linear polymer molecules can easily be tested to arrive at a suitable material for the selected purposes.

Figure 8:
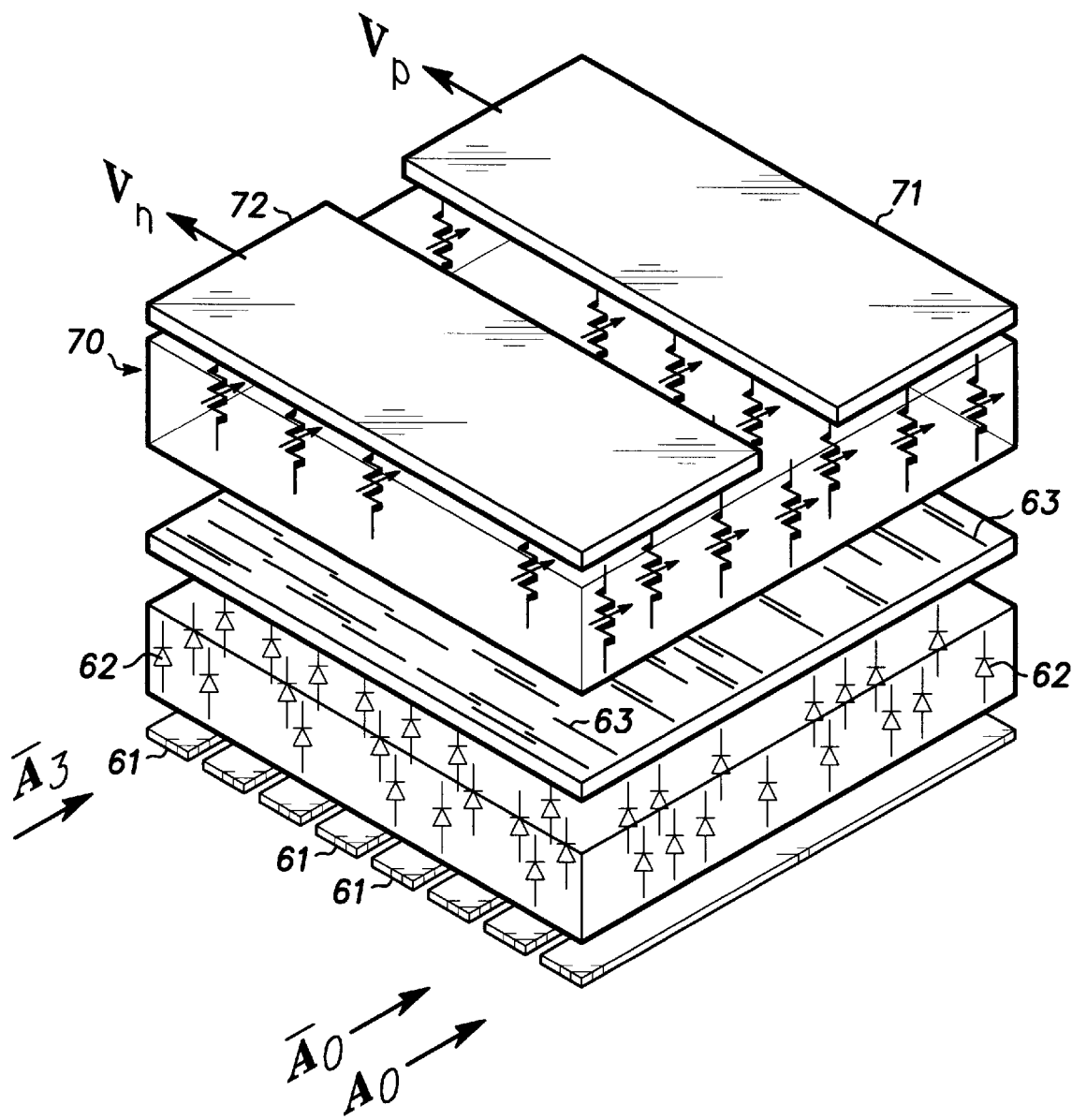
FIG. 8 is a simplified isometric, partial schematic, view of another embodiment of quantum random address memory apparatus in accordance with the present invention.

Referring specifically to FIG. 8, a simplified isometric, partial schematic, view is illustrated of another embodiment of quantum random address memory apparatus, generally designated 60, in accordance with the present invention. Apparatus 60 includes eight address ports, designated $A_0$ through $A_3$, and the invert or reciprocal of each ($-A_0$ through $-A_3$). In this embodiment the address ports are represented by eight parallel spaced apart conductive strips 61, one strip for each of the address ports. A plurality (generally thousands) of mixer elements, which in this embodiment are pseudo-randomly placed self-assembled non-linear polymer molecules 62 positioned in a layer of dielectric material and represented schematically as diodes, each have one end (in this embodiment represented as the anode) coupled to the address ports 61.

A plurality (generally thousands) of pseudo-randomly positioned, but generally parallel oriented electrically conductive polymer molecules 63 (formed in a thin dielectric layer for convenience) are positioned over non-linear polymer molecules 62 so as to extend transverse to the parallel spaced apart strips 61 with individual conductors pseudo-randomly coupled (to the cathodes) to different non-linear polymer molecules or groups of non-linear polymer molecules 62. Electrically conductive polymer molecules 63 can be formed and positioned in a variety of different techniques including, for example, conductive polymers that are suspended in a solution and oriented by a magnetic or electric force during drying of the solution to form a solid layer.

A plurality (generally thousands) of nano-memory elements, which in this embodiment include adaptive polymer molecules 70 illustrated as pseudo-randomly placed adaptive resistors, are positioned in a dielectric layer of material and on the layer containing electrically conductive polymer molecules 63 so as to be pseudo-randomly coupled by different electrically conductive polymer molecules or groups of electrically conductive polymer molecules 63. Thus, electrically conductive polymer molecules 63 generally pseudo-randomly couple one or more non-linear polymer molecules 62 to one or more adaptive polymer molecules 70. While adaptive polymer molecules 70 are illustrated herein as nano-memory elements, it should be understood that other elements can be used, including magnetic tunneling nano-junctions, quantum dots, etc. Adaptive polymer molecules 70 can be fabricated as explained above or they can include, instead, adaptive resistors fabricated, for example, by methods described in U.S. Pat. No. 4,725,791 entitled "Circuit Utilizing Resistors Trimmed by Metal Migration", issued Feb. 16, 1988. Further, non-linear polymer molecules 62, electrically conductive polymer molecules 63, and adaptive polymer molecules 70 can, in many circumstances, be integrated into single polymer molecules or groups of molecules.

A pair of spaced apart electrical conductors 71 and 72 are positioned over adaptive polymer molecules 70 so as to extend parallel with electrically conductive polymer molecules 63 (i.e. arranged so as to thoroughly mix the influences from combinations of address A bits) and transverse to the parallel spaced apart strips 61, with each electrical conductor 71 and 72 coupled to a different approximately one half of the plurality of adaptive polymer molecules 70 (i.e. arranged so as to provide two intrinsically balanced halves of a differential output). Conductors 71 and 72 are connected to provide signals $V_p$ and $V_n$, respectively, which when combined ($V_p-V_n$) produce a data bit output. Generally, conductor 71 defines a 'p' section of apparatus 60 and conductor 72 defines a 'n' section. It should be noted that none of the structure illustrated in FIG. 8 requires lithography, except possibly strips 61 and electrical conductors 71 and 72.

Figure 9:
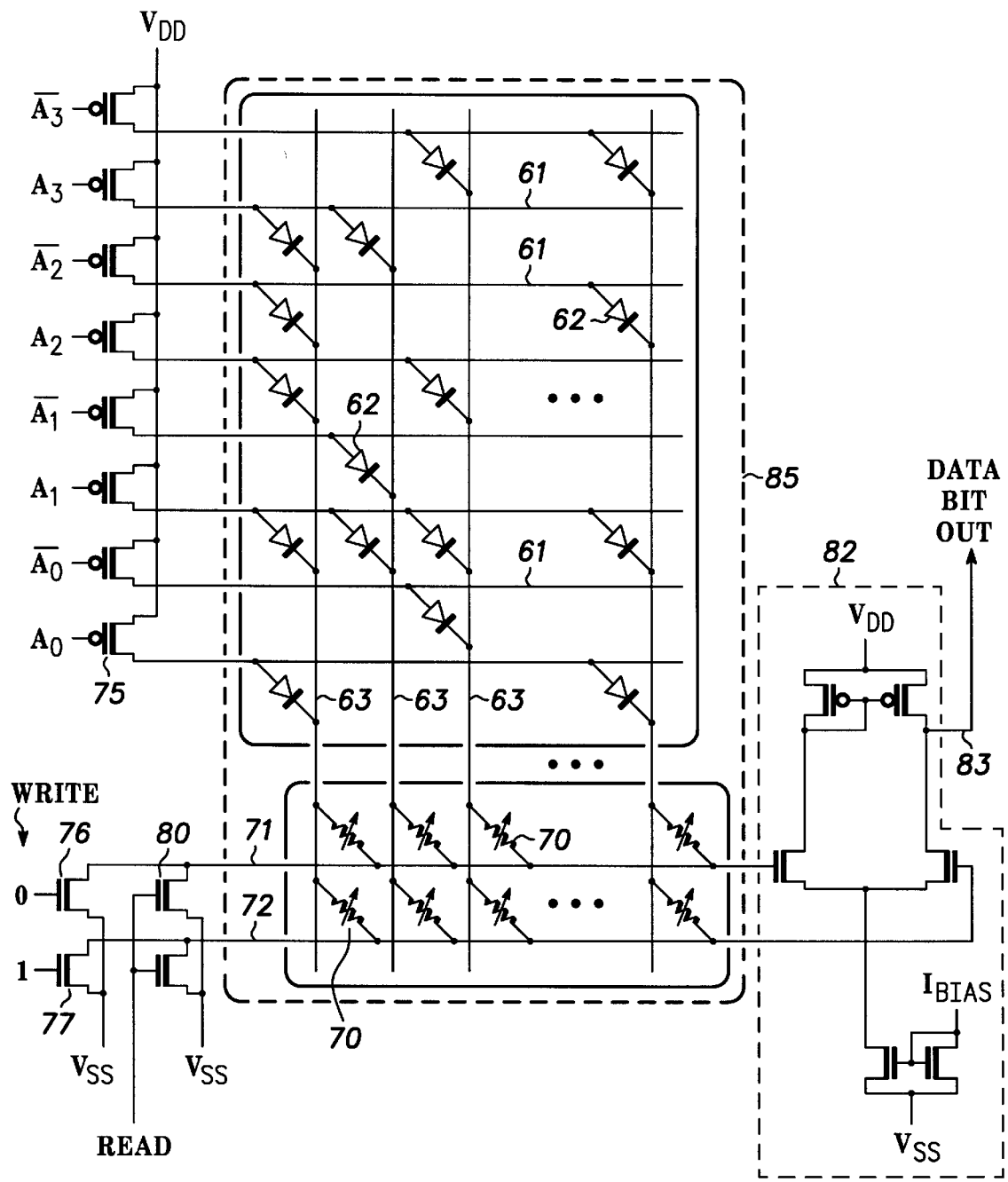
FIG. 9 is a greatly simplified schematic view of the quantum random address memory apparatus illustrated in FIG. 8.

Turning now to FIG. 9, a greatly simplified schematic view is illustrated of the quantum random address memory apparatus illustrated in FIG. 8. The schematic diagram of FIG. 9 is intended to aid in the understanding of apparatus 60 of FIG. 8 and is not intended as a rigorous representation of that apparatus. A plurality of non-linear polymer molecules 62, represented as diodes herein, each have the anode connected to one of the strips 61 and the cathode connected to one of electrically conductive polymer molecules 63 to represent mixer elements. A plurality of adaptive polymer molecules 70, represented herein as adaptive resistors, each have one end connected to either conductor 71 or conductor 72 and a second end connected to one of electrically conductive polymer molecules 63. For convenience of this explanation, electrically conductive polymer molecules 63 are illustrated as single lines extending the length of the apparatus, but it should be understood that these lines and the connections illustrated are generally pseudo-random in length and position. Also, for convenience of this description, each electrically conductive polymer molecules 63 is illustrated as being connected through an adaptive polymer molecule 70 to each conductor 71 and 72. It should be understood, however, that these connections are generally pseudo-random and all of the connections that this implies are possible, from zero connections to non-linear polymer molecules 62 and/or adaptive polymer molecules 70 for some electrically conductive polymer molecules 63 to a plurality of non-linear polymer molecules 62 and/or adaptive polymer molecules 70 for some electrically conductive polymer molecules 63.

In this embodiment, to simply illustrate the operation, each strip 61 is connected by the source-drain of one of eight FETs 75 to a voltage supply $V_{dd}$. To activate selected ones of FETs 75, one input, $A_0$ through $A_3$, and their complements, are applied to each gate of FETs 75. To write a logic '0' into the memory in any selected one of the 16 addresses, the selected address is activated and conductor 71 is connected through the source-drain of a FET 76 to a voltage source $V_{ss}$ and a pulse is applied to the gate of FET 76 in order to turn it on for the pulse width. To write a logic '1' into the memory in any selected one of the 16 addresses, the selected address is activated and conductor 72 is connected through the source-drain of a FET 77 to the voltage source $V_{ss}$ and a pulse is applied to the gate of FET 77 in order to turn it on for the pulse width. Thus, when writing a logic '0', current flows from $V_{dd}$ generally through multiple selected FETs 75, the specific strip 61 connected to the selected FET 75, through all circuits completed to conductor 71 by connections of non-linear polymer molecules 62, electrically conductive polymer molecules 63 and adaptive polymer molecules 70, and through FET 76 to $V_{ss}$. Similarly, when writing a logic '1', current flows from $V_{dd}$ generally through multiple selected FETs 75, the specific strip 61 connected to the selected FETs 75, through all circuits completed to conductor 72 by connections of non-linear polymer molecules 62, electrically conductive polymer molecules 63 and adaptive polymer molecules 70, and through FET 77 to $V_{ss}$. The flow of current produced by the write circuit adjusts the adaptive polymer molecules 70 (as explained in conjunction with FIG. 7) so that the current paths formed are predominant during read operations over any other possible current paths.

A read circuit includes a pair of FETs 80, each connecting one of the conductors 71 and 72 through a source-drain to voltage supply $V_{ss}$. and both activated by a positive 'read' pulse on the gates. The read circuit further includes a differential amplifier comparator circuit, generally designated 82, having conductors 71 and 72 connected as opposed inputs and a single bit output 83. In this specific embodiment, apparatus 60 of FIG. 9 is connected to operate as a one-time-field-programmable-ROM. Further, because addresses $A_0$ through $A_3$, and their complements are illustrated, 16 memory locations are possible. Here it should be understood that this small memory capacity is used only to simplify the illustration and the accompanying explanation. Data output port 83 is one bit wide, thus, providing a memory 16×1. Multiple bit width ports are possible by simple extensions of the present description.

A broken line 85 around all but the contact ends of strips 61, non-linear polymer molecules 62, electrically conductive polymer molecules 63, and adaptive polymer molecules 70, indicates that all components therein are self-organized nanometer sized elements. It should be specifically noted that no transistors or other patterned devices are needed within broken line 85. Ordinary 0.5 micrometer CMOS techniques can be used to fabricate all of the transistors and circuitry outside of broken line 85. Also, an ordinary 0.5 micrometer CMOS external circuit (not shown) can interface with apparatus 60 by driving the address lines ($A_0$ through $A_3$, and their complements) and write control lines and by reading the logic level on data output port 83. The external circuit applies an address A, which causes (most of) many small currents to flow into a specific subset of adaptive memory elements $M_n$ and $M_p$ and finally to $V_{ss}$. Although this specific subset is initially determined by pseudo-random placement of junctions and adaptive elements, it is uniquely associated with just one address $A_i$, due to statistics of large pseudo-random numbers. Furthermore, writing data to one address does not lead to a data bit error at another address, again due to the statistics of large random (uncorrelated) numbers.

The thousands of adaptive nano-resistors 70 change resistance values when data is written to apparatus 60 (coincident with the application of a specific address $A_i$. Adaptive polymer molecules 70 are somewhat like artificial neural network synapses, in that they obey a Hebbian-like learning rule (i.e. they further lower their resistance when current flowing there through exceeds a fixed threshold). Note: Alternatively, reversible conductance changes can be used. To write data to apparatus 60, currents are allowed to exceed the fixed threshold, thereby allowing adaptive polymer molecules 70 to change resistance values. The external circuit applies an address $A_i$, which cause (most of) many small currents to flow into a specific subset, $M_n$ and $M_p$, of adaptive polymer molecules 70 and finally to $V_{ss}$ via either write transistor 76 or 77. In this specific embodiment, if a logic '1' is written, then more current flows in the $M_p$ set (conductor 72) of adaptive polymer molecules 70, causing them to lower their resistance values.

To read data from apparatus 60, currents are limited to values well below the fixed threshold, thereby not allowing adaptive polymer molecules 70 to change resistance values. The external circuit applies an address $A_i$, which causes (most of) many small currents to flow into a specific subset, $M_n$ and $M_p$, of adaptive polymer molecules 70 (memory elements) and finally to $V_{ss}$. The current difference between the $M_n$ and $M_p$ adaptive polymer molecules 70 sets is amplified to saturation by comparator circuit 82 yielding the data bit output signal. If more current flows in the $M_n$ set, then the data bit is read as a logic '1'. Otherwise it is a logic '0'.

Figure 10:
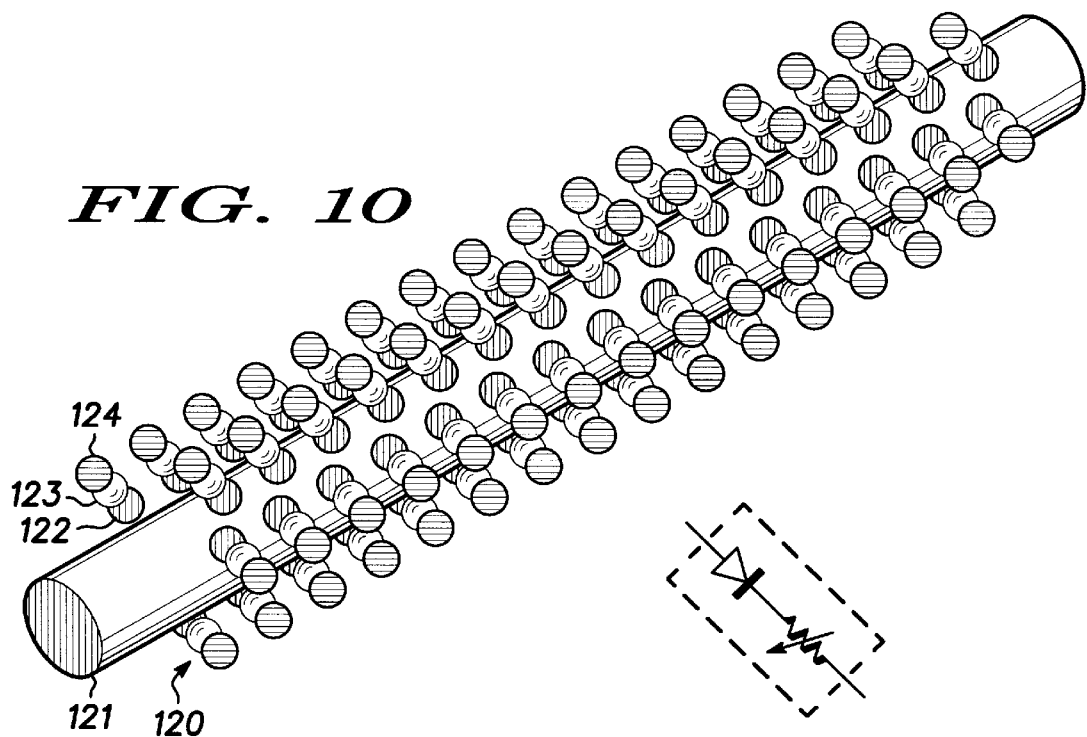
FIG. 10 is a simplified and greatly enlarged isometric view of a fiber and self-assembled layer of molecules forming non-linear and/or adaptive molecules.
Figure 11:
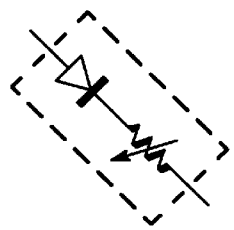
FIG. 11 is a schematic representation of a single molecule from the structure of FIG. 10.

Turning now to FIG. 10, a simplified and greatly enlarged isometric view is illustrated of non-linear and adaptive molecules 120 formed on a fiber 121. Fiber 121 is any convenient conductive or conductive-coated fiber, such as aluminum, a conductive polymer molecule, or the like. Molecules 120 are self-assembled molecules each having a first component 122 which bonds to fiber 121, which in this embodiment is aluminum. Either component 122 forms a diode (non-linear connection) in conjunction with fiber 121 or a second component 123 forms a diode (non-linear connection) in conjunction with component 122. A tail or end component 124 completes each of the molecules 120. Large groups of the fibers with molecules attached are included in a layer or solution so that pseudo-random connections occur between fibers and molecules to produce the mixer/memory features described above. Since most polymers will change their conductivity or capacitance under the influence of excess current (or other electrical characteristics) due to enormous Coulomb forces on relatively weak bonds, molecules 120 can be easily engineered to include both non-linear and adaptive characteristics, as illustrated schematically in FIG. 11. To write data to the apparatus, currents are allowed to exceed a fixed threshold, thereby causing adaptive molecules to change resistance values. To read data from the apparatus, currents are limited to values well below the fixed threshold, thereby not allowing adaptive polymer molecules to change resistance values.

Figure 12:
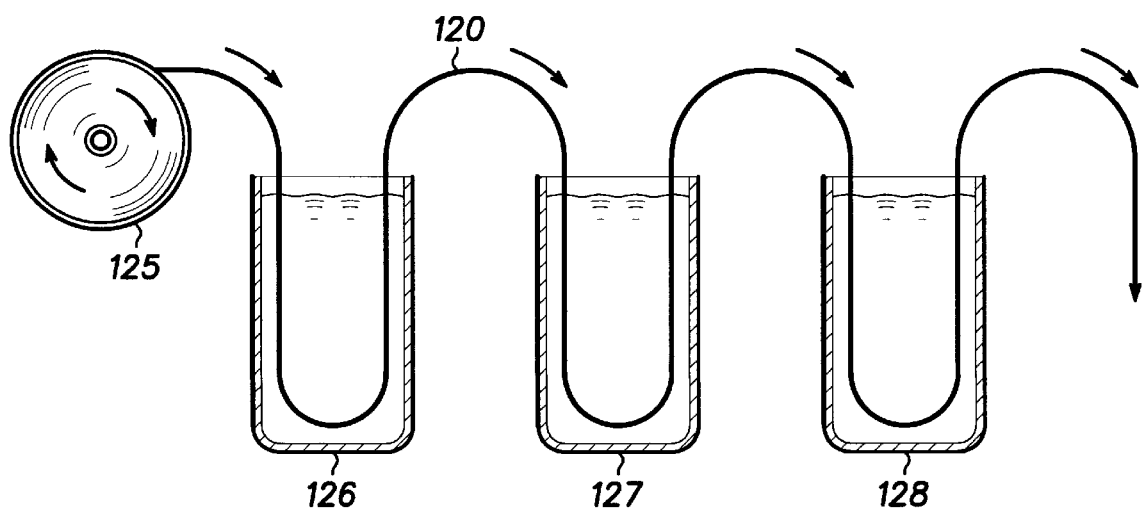
FIG. 12 is a simplified fabrication process for the structure of FIG. 10.

Referring to FIG. 12, a simplified fabrication process is illustrated for the structure of FIG. 10. A supply reel 125 having a continuous fiber 120 thereon is provided. Fiber 120 is passed through a first tank 126 for cleaning any foreign material, oxides, or the like, from the surface. The clean fiber is then passed through a tank 127 containing self-assembling molecules in solution. Fiber 120 with self-assembled molecules thereon is then passed through a tank 128 of hardener which fixedly holds the self-assembled molecules in place. Fiber 120 with self-assembled molecules fixed thereon can then be stored for further processing or the fiber can be introduced directly into a container (not shown) which provides the address and output nodes or ports.

Figure 13:
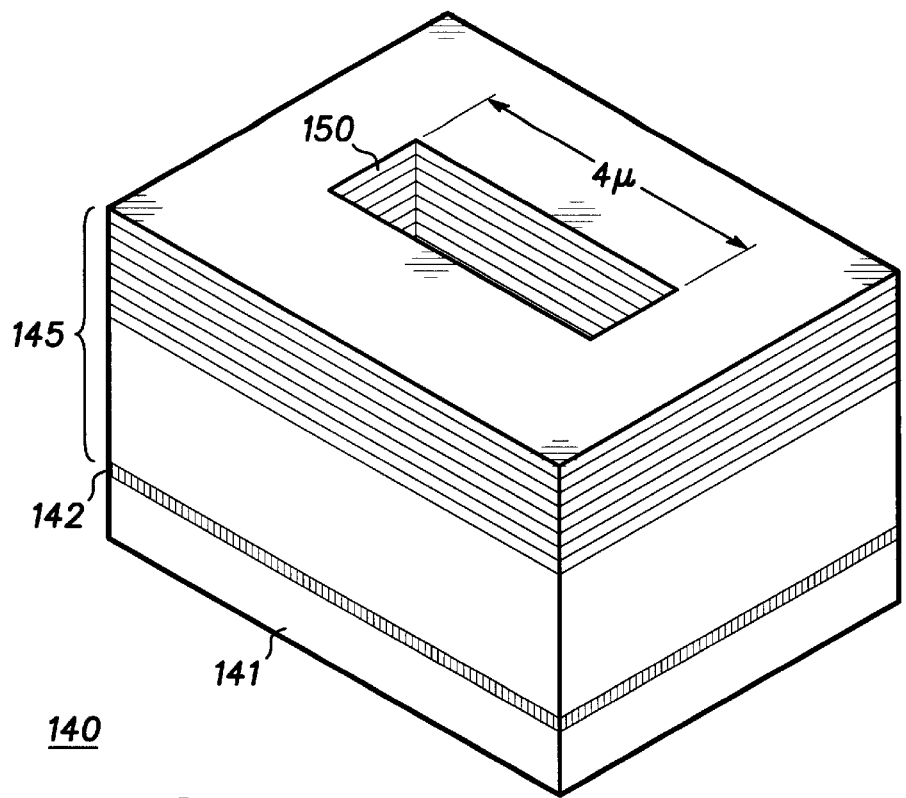
FIG. 13 is a simplified and enlarged isometric view of semiconductor circuitry for use with the quantum random address memory apparatus disclosed herein.

Turning now to FIG. 13, a simplified and enlarged isometric view is illustrated of a semiconductor structure, generally designated 140, for use with the quantum random address memory apparatus disclosed herein. Structure 140 includes a substrate 141 with semiconductor circuits 142, such as CMOS circuits or the like, for drive circuits, timing circuits, and any other integratable circuits included in devices in which the quantum random address memory apparatus is utilized. A plurality of epitaxial layers 145 are formed on semiconductor circuits 142 and a contact well 150 is defined in epitaxial layers 145 for the incorporation of quantum random address memory apparatus.

Figure 14:
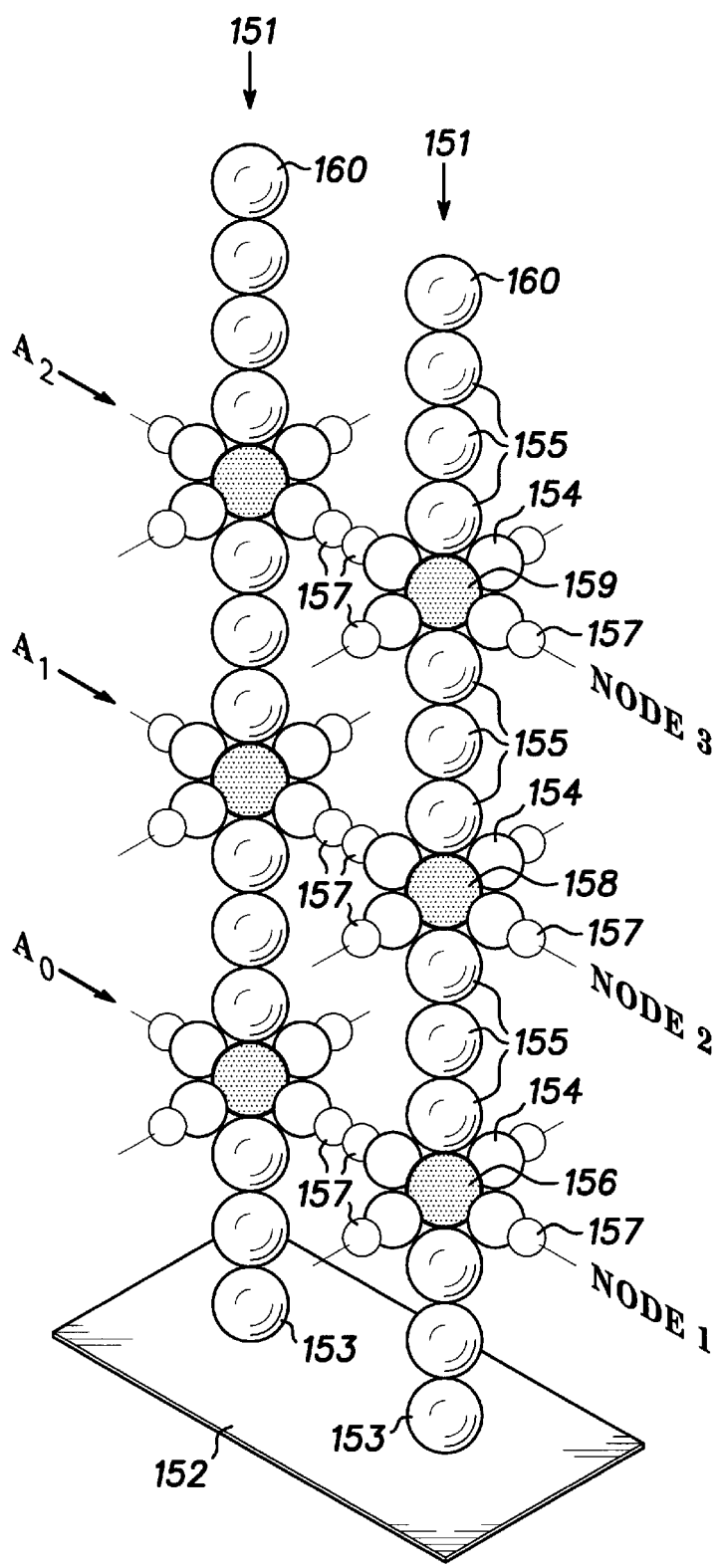
FIG. 14 illustrates greatly enlarged molecules designed for the structure of FIG. 13.

Referring in addition to FIG. 14, greatly enlarged non-linear and/or adaptive molecules 151 are illustrated, which molecules 151 are designed for inclusion in contact well 150 of semiconductor structure 140. Molecules 151 are specifically designed for semiconductor structure 140 and for contact with epitaxial layers 145 defining contact well 150. In this specific embodiment, a thin layer 152 of some type of contact material, such as gold, is deposited on the lower surface of contact well 150 and a first conductive atom or component 153, which is specifically selected to form an electrical and physical contact with layer 152, is deposited on layer 152. Here it should be noted that layer 152 can be formed as a plurality of spaced apart address strips or as an output node, such as the pair of spaced apart electrical conductors previously described (see, for example, address strips 31 or spaced apart electrical conductors 33 and 34 of FIG. 6) or it can simply be a common connection with the address and output nodes formed in epitaxial layers 145.

A plurality of backbone atoms 155 are positioned on a conductive atom 153 and a conductive first node atom 156 is positioned thereon. Conductive address atoms 157 are coupled to first node atom 156 and to first node atoms 156 in adjacent molecules 151. Additional backbone atoms 155 and a conductive second node atom 158 are added with a next layer of conductive address atoms 157 coupled to second node atom 158. Additional backbone atoms 155 and a conductive third node atom 159 are added with a next layer of conductive address atoms 157 coupled to third node atom 159. Insulating atoms 154 are included between address atoms 157 and node atoms 156, 158, and 159 to insulate address current from the backbone current. The process is repeated as often as is required for the number of address nodes desired and each molecule 151 is terminated with one or more backbone atoms 155 and a tail atom 160. The tail atom is included to promote self-assembly. Generally, first, second, and third node atoms 156, 158, and 159, respectively, are pseudo-randomly selected (by self-assembly) to conduct when either a negative or a positive voltage is applied to the corresponding node. That is, any given address A will cause high conductivity through a subset of the molecules 151 in FIG. 14, allowing access (read or write) to the corresponding subset of memory elements 162 and 162 in FIGS. 15 and 16.

Alternatively, first, second, and third node atoms 156, 158, and 159, respectively, are pseudo-randomly selected (by self-assembly) to conduct or not to conduct when a significant voltage (e.g. 1 Volt) is applied to the corresponding node. (In this case, both $A_j$ and $-A_j$ should be supplied for each address bit, using 0 and 1 coding). That is, any given address A will cause high conductivity through a irregularly distributed subset of the molecules 151 in FIG. 14, allowing access (read or write) to the corresponding subset of memory elements 162 and 162 in FIGS. 15 and 16. Note, in this embodiment, each molecule 151 can provide a complete address decode, resulting in perfectly uncorrelated and independent memory statcell independence.

Figure 15:
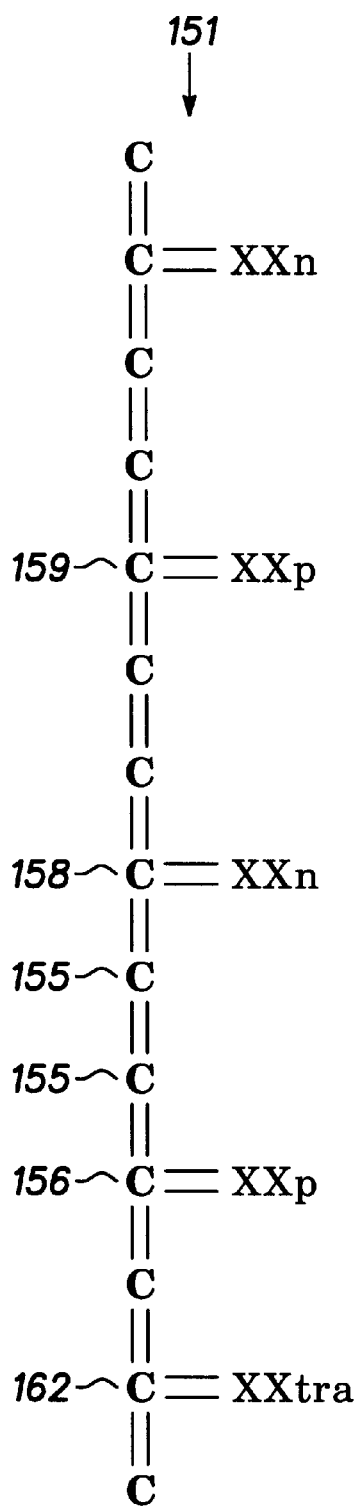
FIG. 15 illustrates typical organic construction of the molecules of FIG. 14.
Figure 16:
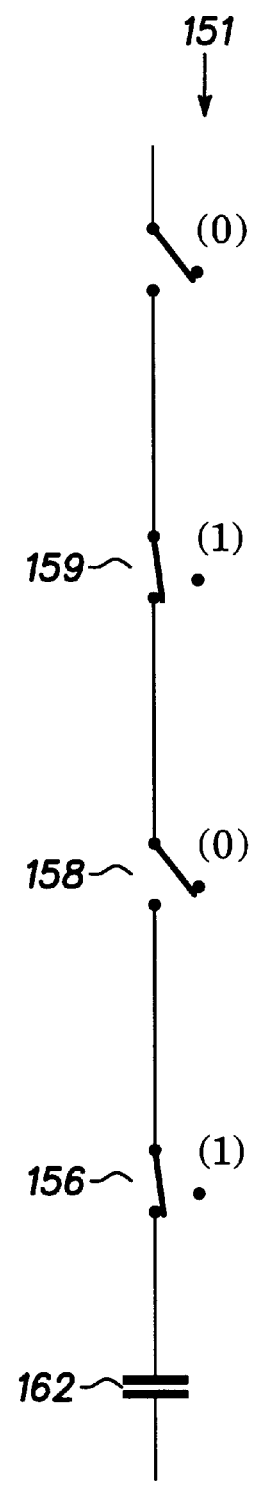
FIG. 16 is a schematic representation of a molecule from FIG. 14.

With still further reference to FIG. 15, a specific example of typical organic construction for molecule 151 is illustrated. The numbers used in FIG. 15 are similar to those used in FIG. 14 for similar components to promote correspondence and understanding. In this example backbone atoms 155 are all included in a carbon chain. First, second, and third node atoms 156, 158, and 159 are carbon atoms with additional atoms (xxn or xxp) bonded to form the desired conduction. The first, second, third, etc. node atoms provide electron conduction to the same node level on adjacent molecules 151. Also, the node atoms switch (i.e. interrupt or not interrupt) current along the backbone, depending upon the voltage applied to the address node in the form of an address bit. In this instance, for the xxp portion a positive voltage enables conduction on this segment of the backbone and for the xxn portion a negative voltage enables conduction on this segment of the backbone.

In the specific example illustrated in FIG. 15, the head and tail groups are not shown but will be understandable to those skilled in the art of self-assembling molecules. Also, a first conductive atom 162 is illustrated with xxtrap bonded thereto. The xxtrap portion represents a charge trap or molecule reconfiguration which serves as the adaptive portion or the memory element. Thus, while molecule 151, as illustrated in FIG. 15, includes both non-linear and adaptive characteristics so that it provides both the mixer elements and the memory elements, it should be understood that separate molecules can be provided for each of these characteristics in specific applications. The conductive or non-conductive character of the various portions of molecule 151 are illustrated schematically in FIG. 16 wherein each node atom 156, 158, and 159 is represented by an open or closed electrical switch similarly designated and first conductive atom 162 with the xxtrap bond is represented by a capacitor similarly designated.

Figure 17:
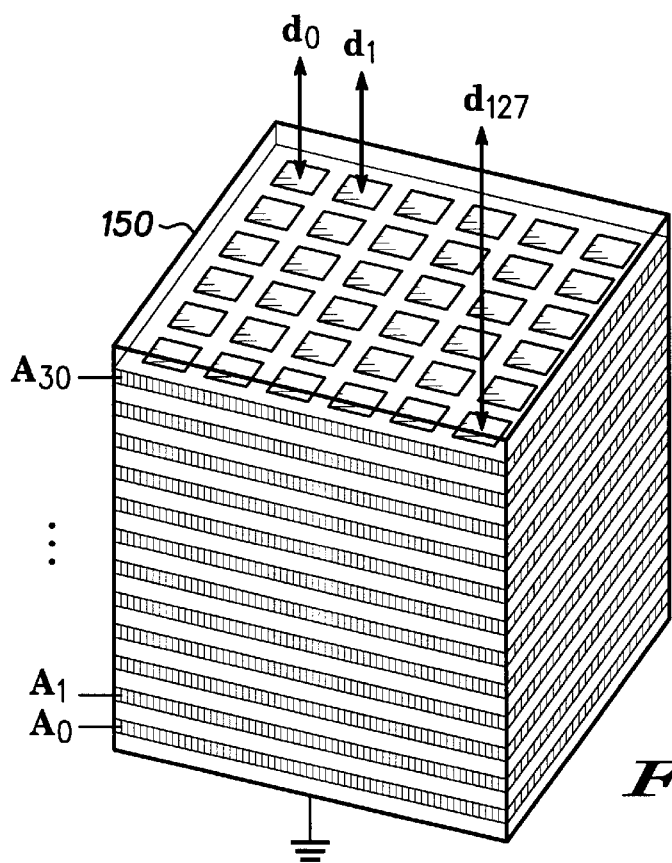
FIG. 17 illustrates a simplified fabrication process for the molecules of FIG. 14.

Turning now to FIG. 17 a simplified fabrication process is illustrated for the molecules of FIG. 14. Contact well 150 is illustrated including a plurality or stack of layers of material sequentially positioned therein. Each layer of the stack of layers provides one of the atoms in the backbone of the molecules described in conjunction with FIG. 14, with the layers containing the first, second, third, etc. node atoms 156, 158, 159, etc. being electrically coupled to conductive epitaxial layers 145 (see FIG. 13). Generally, the stack of layers is formed by introducing immiscible liquids into contact well 150, which liquids are later converted to gels or solids. The stack of layers, in this specific embodiment is 1 cm$^3$ and provides 10$^{15}$ molecules 151. A plurality of output pads d0 through d127 are formed on the upper surface of the stack of layers, each output pad being in communication with the tail group of a different plurality of molecules 151.

Figure 18:
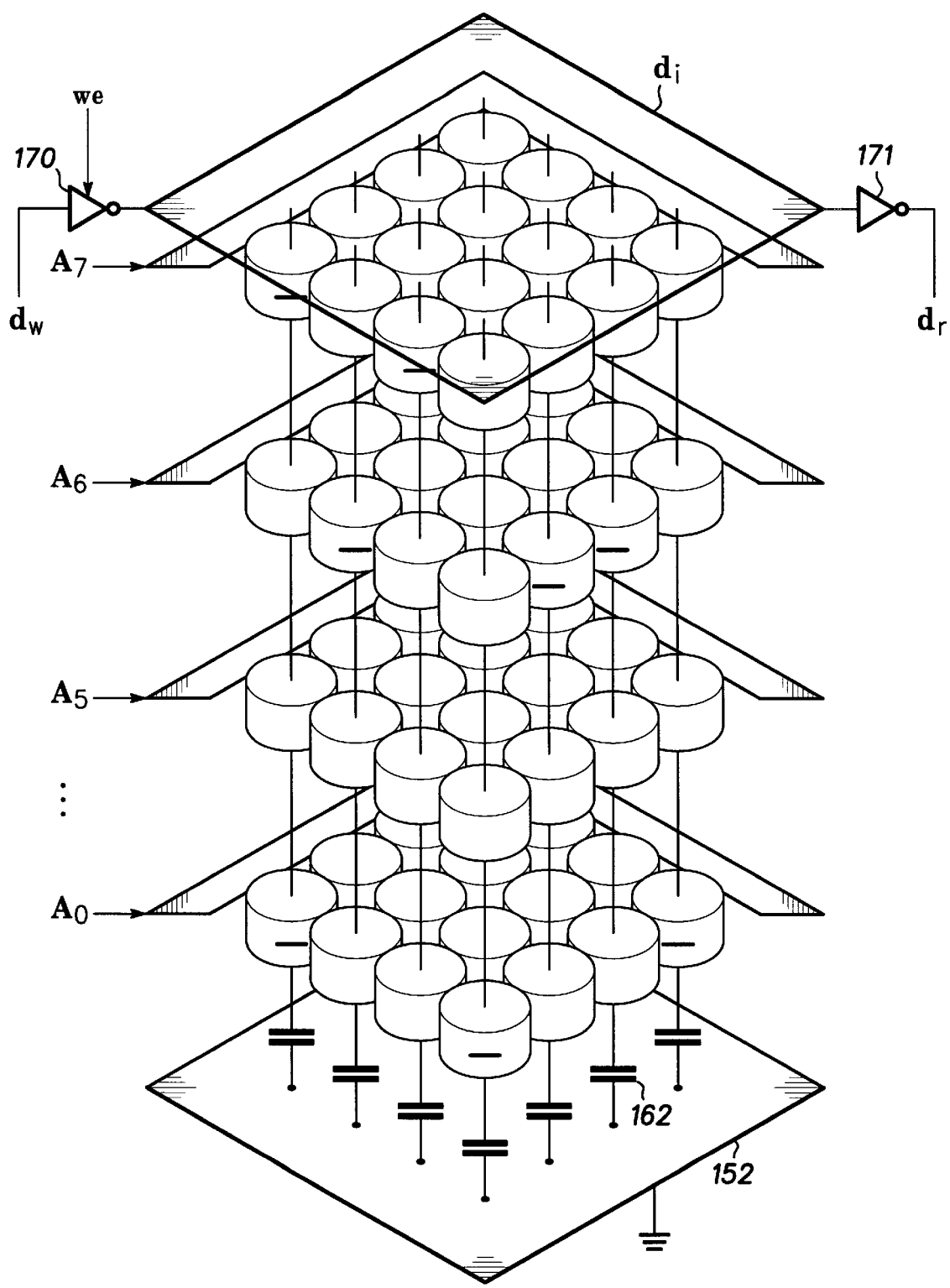
FIG. 18 is a greatly enlarged isometric, schematic view of a portion of the structure illustrated in FIG. 17.

With additional reference to FIG. 18 a greatly enlarged isometric, schematic view is illustrated of a single output pad di and the molecules 151 coupled thereto. Each layer of node atoms in molecules 151 is represented by a cylinder and the backbone atoms 155 between node atoms have been left out for ease of understanding. Further, address atoms 157 are represented as a conductive plain or address node A0 through A7. Conductive atoms 162 with xxtrap bonds are represented as storage capacitors having one terminal connected to conductive layer 152, which is grounded, and the other terminal connected through the backbone to output pad di. In the operation of this structure, writing is accomplished by applying a write signal to output pad di through write circuitry represented by an amplifier 170, which write signal travels along the backbones of molecules 151 to conductive atoms 162, conductive layer 152 and ground. Reading is accomplished in a reverse fashion by way of an output amplifier 171 coupled to output pad di.

Figure 19:
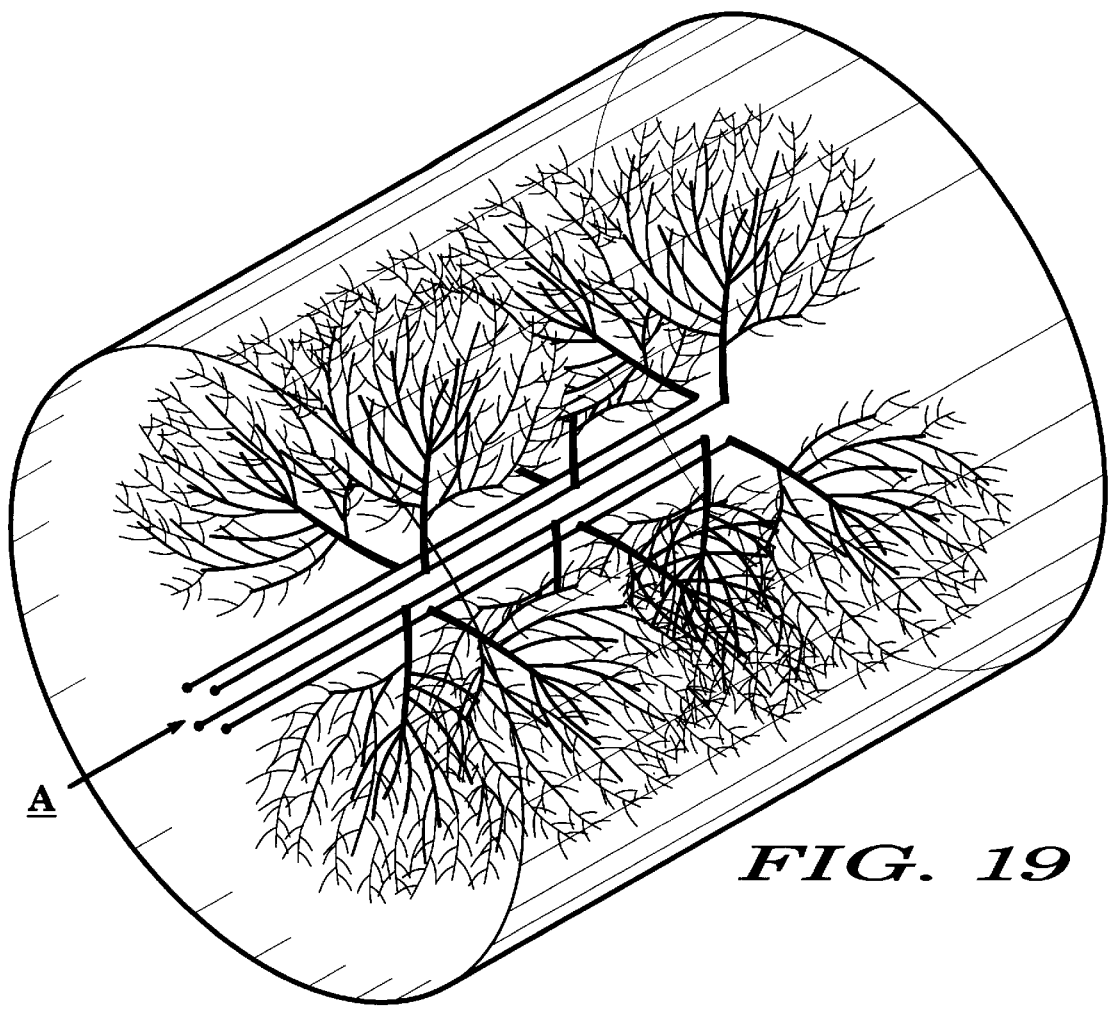
FIG. 19 illustrates cylindrical symmetry, quantum random address memory apparatus with dendritic shaped data collection in accordance with the present invention.
Figure 20:
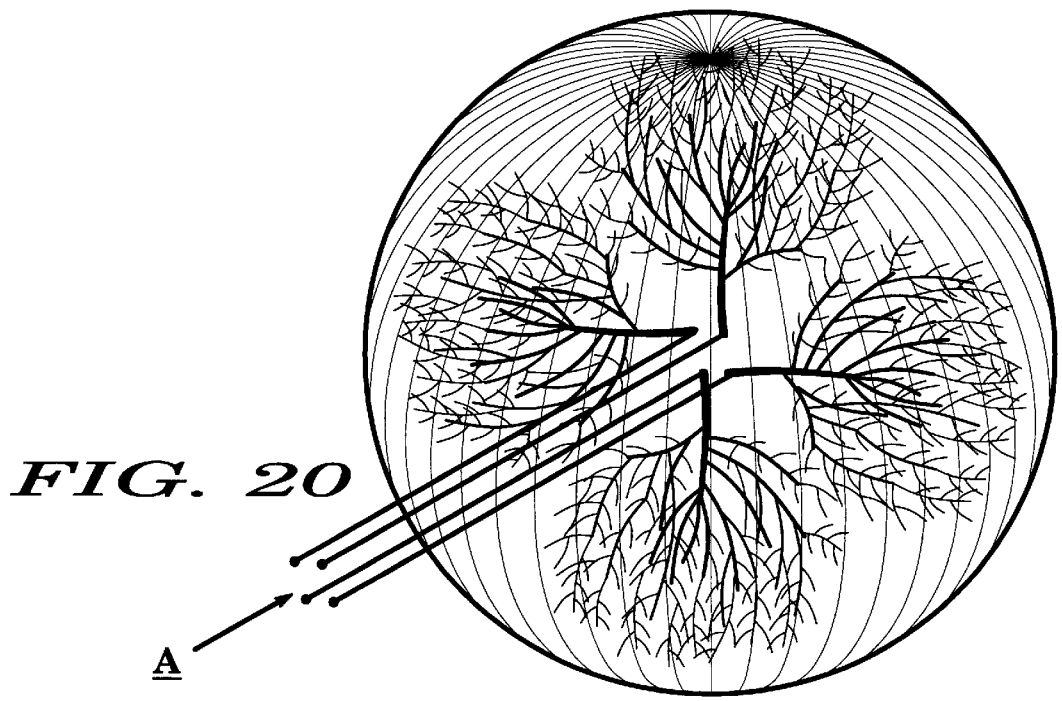
FIG. 20 illustrates spherical symmetry, quantum random address memory apparatus with dendritic shaped data collection in accordance with the present invention.

Thus, it should be understood from the above that polymers can be utilized in quantum random address memory apparatus for the mixer elements, the memory elements, or for both the mixer and memory elements. In the embodiments described above, as a mixer, the polymer receives an electric potential or current from address electrodes (e.g. A0, −A0, A1, −A1 . . . ) and conducts these address signals via conductive or semi-conductive molecular backbones in a pseudo-random spatial pattern to the nano-memory elements (which themselves can be part of the polymer). Along the way, these signals undergo non-linear interactions, e.g. via soliton blocking (as demonstrated in polyacetelyne) or FET-like field effect (pinch-off), thereby performing the mixer operation. The geometry can take on a variety of shapes, including block laminar, coaxial, nested spheres, etc. Other examples include 3 dimensional cylindrical symmetry, quantum random address memory apparatus with dendritic shaped (tree branch-like) $V_p$, $V_n$ data collection wherein the diameter fits local current (in minimum volume) illustrated in FIG. 19, and 3 dimensional spherical symmetry, quantum random address memory apparatus with dendritic shaped A to Z mixer in which the diameter fits local current (in minimum volume) illustrated in FIG. 20. In all instances the polymer is selected and processed such that parasitic currents are minimized. Thus, the connectivity in the polymer is isotropic but still provides for the non-linear interactions. Some candidate polymers are polythiophene, polyaniline, polypyrrole, etc.

When the nano-memory elements are included in the polymer, the nano-memory elements act as adaptive conductors or adaptive capacitors. Many adaptive mechanisms are possible depending upon the specific polymer material and the mode of operation (e.g. current/charge, AC/DC, etc.). For example, with sufficiently high current or charge density most conductive or semiconductor polymer molecules change their conductivity or capacitance due to the enormous Coulomb forces on relatively weak bonds. It is likely that the molecules electrical conduction mechanism will be altered by these altered bonds. In general, molecules in the polymer undergo a relatively permanent conformal (shape) or bond pattern change due to the electrical force from both Zj (high dimensional pseudo-random pattern) and the $V_p$ or $V_n$ data programming inputs. The principle responsible for keeping memory statcells separate is explained above in conjunction with FIG. 2.

For example, when address A=35 is applied, a 5 million element Z pattern of charge is generated, which interacts with the 5 million or so nearby memory elements (each being one or more atoms). During writing, that interaction results in numerous changes in the adaptive element conductive or capacitive values. During reading, that interaction results in a data bit from the differential signal at $V_p$–$V_n$ terminals.

Thus, a new and improved memory which does not require the individual addressing via critically placed conductors of each bit in the memory for read and/or write operations is disclosed. The new and improved memory is relatively simple and inexpensive to manufacture and has virtually no upper limits on the size, or number of bytes it can store. Also, the new and improved memory is highly manufacturable and does not require lithography to produce the memory elements but is still much smaller than prior art memories.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. A quantum random address memory with polymer mixer comprising:
   a plurality of address ports providing a low dimensional plurality of addresses;
   data output structure;
   a plurality of nano-memory elements;
   a plurality of pseudo-randomly positioned, non-linear polymer mixer elements coupling one of the plurality of address ports and the data output structure to a high dimensional plurality of the plurality of nano-memory elements; and
   the other of the plurality of address ports and the data output structure being coupled to the plurality of nano-memory elements, wherein the high dimensional plurality of nano-memory elements is greater than the low dimensional plurality of addresses.

2. Quantum random address memory apparatus as claimed in claim 1 wherein the high dimensional plurality of nano-memory elements is greater than the low dimensional plurality of addresses by at least a factor of 40.

3. Quantum random address memory apparatus as claimed in claim 1 wherein the plurality of pseudo-randomly positioned, non-linear polymer mixer elements include one of conductive and semi-conductive molecules.

4. Quantum random address memory apparatus as claimed in claim 1 wherein the mixer elements include pseudo-randomly placed self-assembled polymer chains.

5. Quantum random address memory apparatus as claimed in claim 1 wherein the nano-memory elements each include one of a polymer, quantum dots, magnetic tunneling junctions, and resistors.

6. Quantum random address memory apparatus as claimed in claim 1 wherein the plurality of address ports include parallel spaced apart conductive strips, one strip for each of the address ports and the data output structure includes a pair of spaced apart electrical conductors extending transverse to the parallel spaced apart strips with each electrical conductor coupled to a different approximately one half of the plurality of nano-memory elements.

7. Quantum random address memory apparatus as claimed in claim 1 wherein the plurality of pseudo-randomly positioned, non-linear mixer elements include a plurality of pseudo-random electrically conductive molecules and a plurality of pseudo-random non-linear polymer molecules positioned to pseudo-randomly couple the plurality of address ports to the plurality of nano-memory elements.

8. Quantum random address memory apparatus as claimed in claim 7 wherein the plurality of pseudo-random electrically conductive molecules include self-assembled conductive polymer chains.

9. Quantum random address memory apparatus as claimed in claim 1 wherein the plurality of nano-memory elements include adaptive polymer molecules.

10. A quantum random address memory with polymer mixer comprising:
    a plurality of address ports providing a low dimensional plurality of addresses;
    data output structure;
    a plurality of polymer nano-memory elements;
    a plurality of pseudo-randomly positioned, non-linear mixer elements coupling one of the plurality of address ports and the data output structure to a high dimensional plurality of the plurality of polymer nano-memory elements; and
    the other of the plurality of address ports and the data output structure being coupled to the plurality of polymer nano-memory elements, wherein the high dimensional plurality of polymer nano-memory elements is greater than the low dimensional plurality of addresses.

11. Quantum random address memory apparatus as claimed in claim 10 wherein the high dimensional plurality of nano-memory elements is greater than the low dimensional plurality of addresses by at least a factor of 40.

12. Quantum random address memory apparatus as claimed in claim 10 wherein the mixer elements each include one of pseudo-randomly placed nano-diodes and self-assembled conductive polymer chains.

13. Quantum random address memory apparatus as claimed in claim 10 wherein the address ports include parallel spaced apart conductive strips, one strip for each of the address ports and the data output structure includes a pair of spaced apart electrical conductors extending transverse to the parallel spaced apart strips with each electrical conductor coupled to a different approximately one half of the plurality of polymer nano-memory elements.

14. Quantum random address memory apparatus as claimed in claim 10 wherein the plurality of pseudo-randomly positioned, non-linear mixer elements include a plurality of pseudo-random electrically conductive molecules and a plurality of pseudo-random non-linear polymer molecules positioned to pseudo-randomly couple the plurality of address ports to the plurality of nano-memory elements.

15. Quantum random address memory apparatus as claimed in claim 14 wherein the plurality of pseudo-random electrically conductive molecules include self-assembled conductive polymer chains.

* * * * *